United States Patent [19]

Baum et al.

[11] Patent Number: 4,880,959

[45] Date of Patent: Nov. 14, 1989

[54] PROCESS FOR INTERCONNECTING THIN-FILM ELECTRICAL CIRCUITS

[75] Inventors: Thomas H. Baum, San Jose; Paul B. Comita, Menlo Park; Robert L. Jackson, San Jose, all of Calif.

[73] Assignee: International Business Machines Corporation, Armonk, N.Y.

[21] Appl. No.: 263,103

[22] Filed: Oct. 26, 1988

[51] Int. Cl.⁴ .............................................. B23K 26/00
[52] U.S. Cl. ........................... 219/121.85; 219/121.66; 219/121.69
[58] Field of Search ...................... 219/121.64, 121.69, 219/121.66, 121.85, 121.71

[56] References Cited

U.S. PATENT DOCUMENTS

| | | | |
|---|---|---|---|
| 3,229,361 | 1/1966 | Valacich | 29/401 |
| 4,259,367 | 3/1981 | Dougherty | 427/96 |
| 4,272,775 | 6/1981 | Compton et al. | 357/29 |
| 4,358,659 | 11/1982 | Spohnheimer | 219/121 |
| 4,374,314 | 2/1983 | Deacutis | 219/121 |
| 4,381,441 | 4/1983 | Desmarais et al. | 219/121 |
| 4,439,754 | 3/1984 | Madden | 338/320 |
| 4,532,401 | 7/1985 | Shiozaki et al. | 219/121 |
| 4,803,021 | 2/1989 | Werth et al. | 219/121.85 X |

*Primary Examiner*—C. L. Albritton
*Attorney, Agent, or Firm*—Joseph G. Walsh

[57] ABSTRACT

Thin-film electrical circuits are interconnected by a process comprising the steps of partially ablating the existing thin-film conductor at the connection point(s) by means of a pulsed laser and depositing a thin-film metal interconnection over the desired area, which includes the area(s) of the existing thin-film circuit that were exposed the pulsed laser.

7 Claims, No Drawings

PROCESS FOR INTERCONNECTING THIN-FILM ELECTRICAL CIRCUITS

TECHNICAL FIELD

This invention is concerned with a process for interconnecting thin-film circuits. It is particularly useful for repair of open defects in thin-film circuits of micrometer dimensions.

BACKGROUND OF THE ART

There is much prior art in the field of repairing defects in metals in general and open electrical circuits in particular. U. S. Pat. Nos. 3,229,361, 4,259,367, 4,272,775, 4,358,659, 4,374,314, 4,381,441, 4,439,754, and 4,532,401 are representative of this art. As far as we are aware, however, no prior art has involved the process steps involved in the present invention.

DISCLOSURE OF THE INVENTION

Interconnection of thin-film circuits is commonly required in the manufacture of integrated circuits, integrated circuit modules, and printed circuit boards. For example, open defects may occur during the manufacture of thin-film circuitry on an integrated circuit, packaging module, or printed circuit board. To repair these defects, it becomes necessary to interconnect the separated circuit lines across the open defect region by depositing additional metallurgy in the form of a thin-film metal repair patch deposited on the same substrate as the existing circuitry to complete the defective circuit. In another example, it is frequently desirable to produce thin-film circuits for multiple applications by a single general process, where all circuitry common to each application is defined in a first pass. In a second pass, specialized thin-film metal interconnections in different regions of the circuit are deposited on the same substrate as the existing circuit to finalize the circuitry for each application.

It is difficult to form interconnections between thin-film circuits in many cases. For example, the metallurgy in the existing thin-film circuit may consist of multiple layers, where the top layer is a barrier metal, e.g. chromium, that oxidizes to a controlled depth in air, forming a protective, insulating layer. Before a connection can be made to such a circuit, this top protective layer must be removed to achieve good electrical contact between the interconnection metallurgy and the existing circuit. As another example, the abrupt step represented by the edge of the existing circuit line at the point of connection may be sufficiently large that the thin-film metallurgy deposited as an interconnection will not be continuous over the step. In this case, it is necessary to reduce the thickness of the existing circuit, and thereby the step height, at the connection points before the interconnection can be made. As a last example, it is often necessary for a thin-film circuit to remain as planar as possible, so that subsequent circuit layers can be built on top of the existing circuit plane. When a thin-film metal interconnection is to be made on such a planar circuit, the interconnection metallurgy must be deposited in a way that maintains the planarity of that layer. In this case, it is again desirable to reduce the thickness of the existing circuit at the connection points, so that the interconnection metallurgy can be deposited in a manner that prevents it from rising above the circuit plane at the points of connection.

The present invention is a two-step process for interconnecting thin-film circuits in a way that solves the problems described above. In the first step, a pulsed laser is used to ablate partially the metallurgy in a thin-film circuit at the point(s) of interconnection. In the second step, conducting metal is deposited between the interconnection points in a such a manner that the metal also covers the area of the existing circuit that had been previously exposed to the pulsed laser beam. To join two sections of a thin-film circuit, the conducting metal deposited in the second step will be patterned to give the correct thickness, length, and width to form the desired interconnection. This step may be accomplished by a number of different processes that will occur to one skilled in the art. The process described herein may be used to join thin-film circuitry residing on a single plane, or alternatively, it may be used to join thin-film circuits that reside on different planes of a multi-level thin-film circuit. In the latter case, the interconnection metallurgy defined in step two is deposited through a hole in the dielectric layer separating the circuit planes that are to be interconnected.

The partial ablation induced by the pulsed laser treatment in step one above can be readily controlled. By adjusting the fluence of the laser beam and by varying the number of pulses, the desired thickness of metal may be removed reproducibly. Thus, one may remove a metal oxide layer from a thin-film conductor, or one may remove the top layer(s) of metal from a multilayer thin-film conductor, or one may controllably remove a certain thickness of metal to create a step of the desired height in a single-layer or multilayer thin-film conductor. The area of the ablated region is controlled by varying the spot size of the laser beam at the surface of the ablated circuit.

In the preferred embodiment, deposition of a thin-film metallurgical pattern for the interconnection in step two above is accomplished by laser chemical vapor deposition. In this process, a continuous wave laser beam is focused onto the substrate surface within the region to be electrically interconnected. The laser light is absorbed by the substrate surface, resulting in localized heating. Decomposition of the vapor of a metallic compound occurs in the heated region, resulting in localized chemical vapor deposition of high-purity, conducting metal. Various metallic compounds may be used for this process. In the present preferred process, the metallic compounds are the $\beta$-diketonate complexes of gold or copper. Using the two-step interconnection process, where laser chemical vapor deposition is applied in the second step, affords electrical interconnections with excellent electrical properties. No deterioration in electrical performance is observed upon stressing the interconnected circuit with repeated thermal cycles or with high humidity. Alternatively, interconnections made by laser chemical vapor deposition without the pulsed laser ablation step have poor electrical conductance initially, or if the conductance is initially good, it deteriorates upon stressing with repeated thermal cycles or with high humidity.

The following Examples are given solely for purposes of illustration, and are not to be considered limitations of the present invention, many variations of which will occur to those skilled in the art, without departing from the scope or spirit thereof.

EXAMPLE 1

An open thin-film circuit consisting of 15 μm wide, 10 μm thick lines of a multiple metallurgical stack (Cr/Cu/Ni/Au/Cr) on a polyimide substrate was joined by the following interconnection process. One end of the existing circuit was partially ablated at the open defect site with four pulses from an excimer laser (308 nm) at a fluence of 12.7 J/cm$^2$ and a repetition rate of 1 Hz. This was repeated for the end of the existing circuit at the other end of the open defect site. Gold metal was then deposited by laser chemical vapor deposition from a dimethyl gold β-diketonate complex. The laser chemical vapor deposition process was optimized by adjusting the laser power and scan parameters to produce an interconnection line of the required length that has the same thickness and width as the lines of the existing thin-film circuit.

EXAMPLE 2

Two sections of a thin-film circuit consisting of 6 μm thick, 8 μm wide lines of a multiple metallurgical stack (Cr/Cu/Cr) on a polyimide substrate were joined by the following interconnection process. The lines of the existing circuit were partially ablated at the connection points with 2 pulses from an excimer laser (308 nm) at a fluence of 8.6 J/cm$^2$. Gold metal was then deposited by laser chemical vapor deposition from a dimethyl gold β-diketonate complex. The laser chemical vapor deposition process was optimized by adjusting the laser power and scan parameters to produce an interconnection line of the required length that was of the same width and thickness as the lines of the existing circuit and that was coplanar with the remainder of the thin-film circuit.

EXAMPLE 3

Two sections of a thin-film circuit consisting of 15 μm wide, 8 μm thick lines of a multiple metallurgical stack (Cr/Cu/Ni/Au/Cr) on a ceramic substrate were joined by the following interconnection process. The lines of the existing circuit were partially ablated at the connection points with 4 pulses from an excimer laser (308 nm) at a fluence of 12.7 J/cm$^2$. Copper metal was then deposited by laser chemical vapor deposition from a copper β-diketonate complex. The laser chemical vapor deposition process was optimized by adjusting the laser power and scan parameters to produce an interconnection line of the required length with the same thickness and width as the lines of the existing thin-film circuit.

We claim:

1. A process for interconnecting thin-film electrical circuits, said process comprising the steps of: (a) partially ablating the metallurgy at the interconnection points by means of a pulsed laser, and (b) depositing metal to form an interconnection of the desired dimensions.

2. A process as claimed in claim 1 where the interconnection is made for the purpose of repairing an open defect.

3. A process as claimed in claim 1 where the pulsed laser is an excimer laser.

4. A process as claimed in claim 3 where the pulsed laser is an excimer laser operating at 308 nm.

5. A process as claimed in claim 1 where the interconnection metallurgy is deposited by laser chemical vapor deposition.

6. A process as claimed in claim 5 where the metal is gold deposited from a dimethyl gold β-diketonate.

7. A process as claimed in claim 5 where the metal is copper deposited from a copper β-diketonate.

* * * * *